United States Patent
Jones et al.

(10) Patent No.: US 8,964,716 B2
(45) Date of Patent: Feb. 24, 2015

(54) ESTIMATING SIGNAL CHARACTERISTICS

(75) Inventors: Phil Jones, Swindon (GB); Carlo Luschi, Duke Street (GB); Abdelkader Medles, Bristol (GB); Donal Price, Walden Essex (GB)

(73) Assignee: Icera Inc., Wilmington, DE (US)

( * ) Notice: Subject to any disclaimer, the term of this patent is extended or adjusted under 35 U.S.C. 154(b) by 695 days.

(21) Appl. No.: 12/999,895

(22) PCT Filed: May 26, 2009

(86) PCT No.: PCT/EP2009/056375
§ 371 (c)(1),
(2), (4) Date: Apr. 8, 2011

(87) PCT Pub. No.: WO2009/153138
PCT Pub. Date: Dec. 23, 2009

(65) Prior Publication Data
US 2011/0182197 A1  Jul. 28, 2011

(30) Foreign Application Priority Data
Jun. 19, 2008  (EP) ........................................ 0811333

(51) Int. Cl.
| H04L 12/26 | (2006.01) |
| H04B 7/216 | (2006.01) |
| H04K 1/02 | (2006.01) |
| H04B 7/00 | (2006.01) |
| H04B 1/707 | (2011.01) |
| H03G 3/30 | (2006.01) |
| H04B 1/04 | (2006.01) |

(52) U.S. Cl.
CPC .............. *H04B 1/707* (2013.01); *H03G 3/3042* (2013.01); *H04B 1/0483* (2013.01); *H04B 2201/70706* (2013.01)

USPC .......... 370/342; 370/252; 370/320; 370/441; 455/522; 375/297

(58) Field of Classification Search
None
See application file for complete search history.

(56) References Cited

U.S. PATENT DOCUMENTS 6,137,994 A * 10/2000 Alterman et al. ................ 455/69
7,324,828 B2 * 1/2008 Nagaoka et al. .............. 455/522
8,380,238 B2 * 2/2013 Murata ......................... 455/522

(Continued)

FOREIGN PATENT DOCUMENTS

WO     2008130693 A2   10/2008
WO     2009153138 A1   12/2009

*Primary Examiner* — Marcus R Smith
*Assistant Examiner* — Hicham Foud

(57) ABSTRACT

A method of transmitting an RF signal over a wireless communication network is provided. The method comprises determining a respective weighting factor for each of a plurality of digital signals each corresponding to a respective channel, the weighting factors weighting the digital signals to produce a composite signal intended for transmission as an RF signal via a power amplifier. The method further comprises executing instructions on a processor to dynamically calculate a metric related to the non-linearity of the power amplifier's transfer characteristics for the composite signal using the determined weighting factors. The method further comprises supplying to the power amplifier a signal for transmission as an RF signal and amplifying the signal for transmission at the power amplifier to transmit an RF signal over the wireless communication network via at least one antenna. The method further comprises controlling the transmission based on the metric related to the amplifier non-linearity.

35 Claims, 2 Drawing Sheets

(56) References Cited

U.S. PATENT DOCUMENTS

| | | | |
|---|---|---|---|
| 2004/0252667 A1* | 12/2004 | Dent | 370/335 |
| 2005/0025109 A1* | 2/2005 | Ratasuk et al. | 370/342 |
| 2006/0217088 A1* | 9/2006 | Nagaoka et al. | 455/127.1 |
| 2009/0202017 A1 | 8/2009 | Ichihara | |
| 2010/0150126 A1* | 6/2010 | Scholand et al. | 370/342 |

\* cited by examiner

ESTIMATING SIGNAL CHARACTERISTICS

CROSS REFERENCE TO RELATED APPLICATION

This application is the National Stage of, and therefore claims the benefit of International Application No. PCT/EP2009/056375 filed on May 26, 2009, entitled "ESTIMATION SIGNAL PROCESSING," which was published in English under International Publication Number WO 2009/153138 on Dec. 23, 2009, and has priority based on GB 0811333.4 filed on Jun. 19, 2008. Each of the above applications is commonly assigned with this National Stage application and is incorporated herein by reference in their entirety.

FIELD OF THE INVENTION

The present invention relates to a method and apparatus for transmitting an RF signal over a wireless communication network.

BACKGROUND

In a Code-Division Multiple Access (CDMA) cellular communication system, a key component in determining power consumption, performance and cost in the User Equipment (UE) is the Power Amplifier (PA). Non linearity of the PA can cause significant impairment to the quality of the transmitted signal. This effect increases when the PA is run close to its maximum power rating. With current technology, the approach taken to mitigate this problem is to back off the PA (i.e. lower its power) from the region where its input-output characteristic is markedly non linear. At lower powers, the PA input-output characteristic is closer to linear, and hence the backoff causes the PA to operate in a region in which less distortion due to non linearity is introduced.

In modern communications systems, the trend is towards a system designed to handle many different communication types related to different types of applications—for example SMS, voice, video, email, web browsing. These different types of communications are usually based on specific and different transmission formats. The traffic mix to be transmitted by a given user can be changing with time—for example a speech call may be established, and part way through the call, a packet video upload may take place. In certain communication systems, the characteristics of the transmitted signal may vary with time also because of the automatic adaptation of the transmission format based on the propagation channel and traffic conditions. These time varying signal characteristics determine, in turn, the degradation caused by the non linearity in the PA.

A parameter often used to quantify the effect of the signal characteristics on the required power backoff is the Peak to Average Ratio (PAR), defined as the ratio between the peak signal power and average signal power. A signal with higher PAR is likely to suffer more degradation from a given PA operating at a given (average) power than one with lower PAR.

A particular problem faced in the standardisation of 3GPP Wideband CDMA (WCDMA) systems was how to design the uplink in such a way that Adjacent Channel Leakage Ratio (ACLR) is kept under control. ACLR is defined in 3GPP TS 25.101 as a measure of the power leakage into an adjacent carrier, taking into account both transmit and receive Root-Raised Cosine (RRC) filtering. ACLR is one of the important impairments in WCDMA. A primary cause of ACLR is the third order nonlinearity of the PA's transfer characteristic. In 3GPP TSG RAN WG1 #37 Tdoc R1-040642 ("Comparison of PAR and Cubic Metric for Power De-Rating", May 2004) a signal characteristic called the Cubic Metric (CM) is defined, which is strongly related to the PA backoff required to pass a WCDMA signal without degradation. The WCDMA standard has been designed to allow a backoff in the uplink PA maximum power, which can be a function of the cubic metric.

One approach for choosing the power backoff of a PA is given in US patent application no. US2007/0155335 (Robert T. Love, Richard C. Burbidge, Edgar P. Fernandes and Vijay Nangia, "Method and Apparatus for Power Reduction for E-TFC Selection"). This discloses a technique for determining the required back-off from a look-up table of different possible combinations of weighting factors for the different WCDMA channels.

SUMMARY

The above considerations lead to the desire to make the control of the transmission, e.g. the backoff of power applied to the PA, dependent upon the characteristics of the transmitted signal. An important task is therefore to come up with an efficient way of estimating a suitable metric representing the signal characteristics at any time and using that information to apply an appropriate backoff to the PA, or otherwise control the transmission to avoid adverse affects of non-linearity.

According to one aspect of the present invention, there is provided a method of transmitting an RF signal over a wireless communication network, the method comprising: determining a respective weighting factor for each of a plurality of digital signals each corresponding to a respective channel, the weighting factors being for weighting the digital signals for combination to produce a composite signal intended for transmission as an RF signal via a power amplifier; executing instructions on a processor to dynamically calculate, in the processor, a metric related to the non-linearity of the power amplifier's transfer characteristics for the composite signal using the determined weighting factors; supplying to the power amplifier a signal for transmission as an RF signal; amplifying the signal for transmission at the power amplifier to transmit an RF signal over the wireless communication network via at least one antenna; and controlling the transmission based on said metric related to the amplifier non-linearity.

The metric representing the signal characteristics is estimated based on the knowledge of the weighting factors, instead of deriving statistics using the actual signal to be transmitted. This advantageously allows the metric to be estimated earlier and reduces the estimation lag, which, in turn, reduces or eliminates the problem of producing an estimate which is "out of date."

Further, the inventors have recognised that the use of look-up table (as in Love et al. reference above) is cumbersome and wasteful of memory because it requires a large number of parameter combinations for the different channels to be stored. Thus according to the present invention, the metric is calculated dynamically, i.e. "on the fly", using the current values of the signal parameters.

In a preferred embodiment, said communication network may operate according to a set of scrambling codes, and said dynamic calculation may comprise dynamically evaluating an expression in which moments of at least some combinations of said scrambling codes are predetermined to be negligible.

Making assumptions about the moments of scrambling codes advantageously results in a calculation of relatively low computational cost, which is more suitable for execution in real-time on a processor. That is to say, the assumptions reduce the processing cost of the calculation in terms of number of machine cycles, and therefore facilitates its dynamic, real-time execution on a processor.

Further, said communication network may operate according to a set of spreading codes, and said dynamic calculation may comprise dynamically evaluating an expression in which one or more quantities depending on a correlation of some combinations of said spreading codes are predetermined to be negligible.

Making assumptions on the correlation properties of the spreading codes also has the advantage of producing a calculation of relatively low computational cost, which again is more suitable for execution in real-time on a processor. That is to say, the assumptions reduce the processing cost of the calculation in terms of number of machine cycles, and therefore facilitates its dynamic, real-time execution on a processor.

The following embodiments advantageously improve the accuracy of the metric whilst still allowing for a computationally efficient calculation which can be computed dynamically on a processor.

In embodiments, some information on the scrambling and/or spreading codes may be taken into account. Therefore in embodiments, said dynamic calculation may comprise dynamically evaluating an expression that comprises moments of some combinations of the scrambling codes. Said dynamic calculation may comprise using information concerning the spreading codes of said channels. Said dynamic calculation may comprise using information relating to a correlation property of the spreading codes.

Said channels may comprise different physical channels, and said dynamic calculation may comprise dynamically evaluating an expression that comprises transmit filter coefficients and the weighting factors of the different physical channels.

Said calculation of a metric related to the amplifier non-linearity may comprise calculating a cubic metric.

Said channels may comprise different physical channels; and said dynamic calculation of the metric may comprise dynamically evaluating a first term depending on quantities given by sums of powers of the weighting factors of different physical channels applied to an in-phase branch or to a quadrature branch, and on quantities that are function of sums of powers of the samples of a transmit filter impulse response Said dynamic calculation of the metric may comprise dynamically evaluating a second term depending on quantities that are function of powers of samples of a transmit filter impulse response; and adding the second term to the first term.

Furthermore, the following embodiments are particularly effective in controlling the transmission to prevent non-linear behaviour of the power amplifier.

The method may comprise producing the composite signal by combining said digital signals weighted by the respective weighting factors; the supplying of the signal for transmission may comprise supplying the composite signal to the power amplifier for transmission as an RF signal; and the controlling of the transmission may comprise backing off the power of the power amplifier based on said metric related to the amplifier non-linearity.

The controlling of the transmission may comprise making a decision regarding scheduling of said channels based on said metric related to the amplifier non-linearity, thus producing an alternative composite signal; and the supplying of the signal for transmission may comprise supplying the alternative composite signal to the power amplifier for transmission as an RF signal.

In a preferred application of the present invention, the transmission may be a CDMA transmission, and each of said channels corresponds to a respective combination of spreading code, scrambling code and frequency. The transmission may be a WCDMA transmission.

According to another aspect of the present invention, there is provided a transmitter for transmitting an RF signal over a wireless communication network comprising: a power amplifier arranged to amplify its input for transmission of an RF signal over the wireless communication network via at least one antenna; a processor operatively coupled to the power amplifier, the processor being programmed to: determine a respective weighting factor for each of a plurality of digital signals each corresponding to a respective channel; combine said digital signals weighted by said weighting factors to produce a composite signal for supply to the input of said power amplifier; dynamically calculate a metric related to the non-linearity of the power amplifier's transfer characteristics for the composite signal using the determined weighting factors; and control the transmission based on said metric related to the amplifier non-linearity.

According to another aspect of the present invention, there is provided a method of programming a processor to transmit an RF signal over a wireless communication network operating according to a set of scrambling codes, the method comprising: programming the processor to determine a respective weighting factor for each of a plurality of digital signals each corresponding to a respective channel, the weighting factors being for weighting the digital signals for combination to produce a composite signal intended for transmission as an RF signal via a power amplifier; by determining that a moment of some combinations of said scrambling codes is negligible, deriving an expression for calculating a metric related to the non-linearity of the power amplifier using said weighting factors; programming the processor to determine said metric by dynamically evaluating said expression using the weighting factors; programming the processor to supply to the power amplifier a signal for transmission as an RF signal; and programming the processor to control the transmission via the power amplifier based on said metric related to the amplifier non-linearity.

According to another aspect of the present invention, there is provided a method of programming a processor to transmit an RF signal over a wireless communication network operating according to a set of spreading codes, the method comprising: programming the processor to determine a respective weighting factor for each of a plurality of digital signals each corresponding to a respective channel, the weighting factors being for weighting the digital signals for combination to produce a composite signal intended for transmission as an RF signal via a power amplifier; by determining that a correlation property of some combinations of said spreading codes is negligible, deriving an expression for calculating a metric related to the non-linearity of the power amplifier using said weighting factors; programming the processor to determine said metric by dynamically evaluating said expression using the weighting factors; programming the processor to supply to the power amplifier a signal for transmission as an RF signal; programming the processor to control the transmission via the power amplifier based on said metric related to the amplifier non-linearity.

According to another aspect of the present invention, there is provided a computer program product for transmitting an RF signal over a wireless communication network, the program comprising code which when executed on a processor will perform the steps of: determining a respective weighting factor for each of a plurality of digital signals each corresponding to a respective channel, the weighting factors being for weighting the digital signals for combination to produce a composite signal intended for transmission as an RF signal via a power amplifier; dynamically calculating, in the processor, a metric related to the non-linearity of the power amplifier's transfer characteristics for the composite signal using the determined weighting factors; supplying from the processor to the power amplifier a signal for transmission as an RF signal; amplifying the signal for transmission at the power amplifier to transmit an RF signal over the wireless communication network via at least one antenna; and controlling the transmission based on said metric related to the amplifier non-linearity.

According to another aspect of the present invention, there is provided a user equipment for transmitting an RF signal over a wireless communication network comprising: a power amplifier arranged to amplify its input for transmission of an RF signal over the wireless communication network via at least one antenna; a processor operatively coupled to the power amplifier, the processor being programmed to: determine a respective weighting factor for each of a plurality of digital signals each corresponding to a respective channel; combine said digital signals weighted by said weighting factors to produce a composite signal for supply to the input of said power amplifier; dynamically calculate a metric related to the non-linearity of the power amplifier's transfer characteristics for the composite signal using the determined weighting factors; and control the transmission based on said metric related to the amplifier non-linearity.

According to another aspect of the present invention, there is provided a wireless communication system comprising a plurality of base stations and a mobile terminal for transmitting RF signals to the base stations, the mobile terminal comprising: a power amplifier arranged to amplify its input for transmission of an RF signal to a base station via at least one antenna; a processor operatively coupled to the power amplifier, the processor being programmed to: determine a respective weighting factor for each of a plurality of digital signals each corresponding to a respective channel; combine said digital signals weighted by said weighting factors to produce a composite signal for supply to the input of said power amplifier; dynamically calculate a metric related to the non-linearity of the power amplifier's transfer characteristics for the composite signal using the determined weighting factors; and control the transmission based on said metric related to the amplifier non-linearity.

BRIEF DESCRIPTION OF THE DRAWINGS

For a better understanding of the present invention and to show how it may be carried into effect, reference will now be made by way of example to the accompanying drawings in which.

DETAILED DESCRIPTION OF PREFERRED EMBODIMENTS

As discussed above, a relevant metric for the 3GPP W-CDMA uplink transmission is the cubic metric. The following description of the preferred embodiment will be largely centered around this quantity.

The 3GPP specifications (TS 25.101) define the cubic metric CM as $$CM = \text{CEIL}\left\{\frac{20\log_{10}([V^3]_{rms}) - 20\log_{10}([V^3_{ref}]_{rms})}{k}, 0.5\right\} \quad (1)$$

where:

CEIL{x, 0.5} denotes the ceiling function rounding upwards to closest 0.5 dB, so that CM∈[0, 0.5, 1.0, 1.5, 2.0, 2.5, 3.0, 3.5];

k=1.85 for signals where all channelisation codes $C_{SF,n}$ with spreading factor SF and code index n have index n<SF/2;

k=1.56 for signals were any channelisation code $C_{SF,n}$ with spreading factor SF and code index n have index n>SF/2;

V is the normalized voltage waveform of the input signal;

$V_{ref}$ is the normalized voltage waveform of the reference signal (12.2 kbps AMR speech); and $20 \log_{10}((V^3_{ref})_{rms})$=1.52 dB.

Knowing the cubic metric for the current transmit signal configuration, the Maximum Power Reduction (MPR) quantifying the backoff in maximum PA power is given by:

$$\text{MPR(dB)}=\max(CM-1,0) \quad (2)$$

During the system operation, the signal configuration used for uplink transmissions may change over time. This may happen, for example, due to the change in physical channel usage arising from changes in traffic mix and consequent changes in β values (see FIG. 1).

Following WCDMA terminology, the term "physical channel" refers here to an Orthogonal Variable Spreading Factor (OVSF) Spreading Code/Scrambling Code/Frequency combination. Part of the transmit processing of physical channels used in the WCDMA Frequency Division Duplex (FDD) uplink is shown schematically in FIG. 1.

Figure 1:
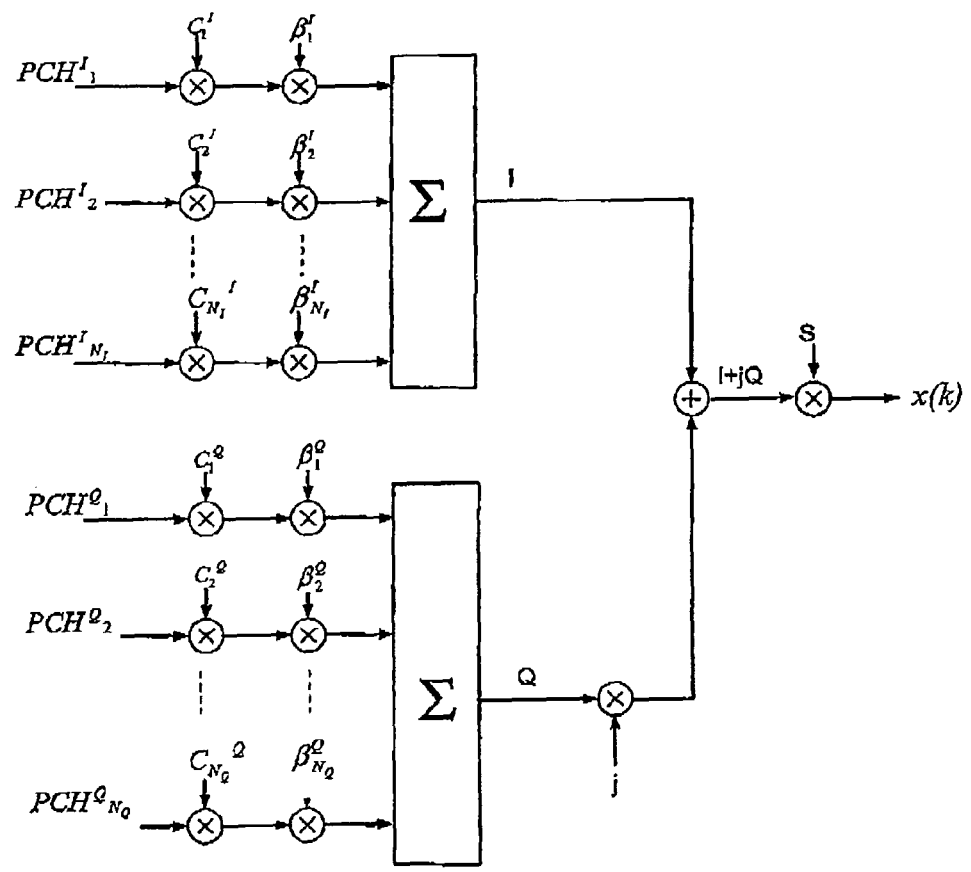
FIG. 1 is a schematic illustration of physical channel transmit processing in a WCDMA uplink.

FIG. 1 schematically depicts a number $N_I$ of physical channels $PCH^I_1$, $PCH^I_2$, ..., $PCH^I_{N_I}$ applied on the in-phase branch I after being spread by channelisation codes $C_1^I$, $C_2^I$, ..., $C_{N_I}^I$ and weighted by factors $\beta_1^I$, $\beta_2^I$, ..., $\beta_{N_I}^I$. Analogously, there is a set of $N_Q$ physical channels $PCH^Q_1$, $PCH^Q_2$, ..., $PCH^Q_{N_Q}$ applied on the quadrature branch Q after being spread by channelisation codes $C_1^Q, C_2^Q, \ldots,$ and weighted by factors $\beta_1^Q, \beta_2^Q, \ldots, \beta_{N_Q}^Q$. The factors β may be referred to as weighting factors.

In the WCDMA system uplink transmission, the signal parameters relevant to the required PA backoff are given by the weighting factors β of the different uplink physical channel.

For example, in WCDMA Release 6, the uplink physical channels can be:
Dedicated Physical Control Channel (DPCCH)
Dedicated Physical Data Channel(s) (DPDCH(s))
Dedicated Physical Control Channel for HS-DSCH (HS-DPCCH)
E-DCH Dedicated Physical Control Channel (E-DPCCH)
E-DCH Dedicated Physical Data Channel(s) (E-DPDCH(s))

and there are various rules governing their assignments to the in-phase (I) or quadrature (Q) branch (3GPP TS 25.213).

Explicitly, changes in physical channel usage referred to above will result in changes in:
a) the physical channels that are present, and
b) the values of $\beta_n^I$ and $\beta_n^Q$ in use at any given time. These correspond to signal configurations with different cubic metric values. In turn, different values of cubic metric correspond to different backoff values that should be applied to the maximum PA power.

Therefore there is a need to be able to obtain the cubic metric value for any combination of β values and channels, in order for the correct backoff to be applied for the current physical channel configuration.

One way to obtain the cubic metric value for a given physical channel configuration would be to compute the cubic metric "on the fly" based on the composite signal. That is, by computing the cubic metric directly from the normalised voltage waveform V of the input signal x(k) (see equation (1)). However, there is a problem associated with this method, caused by the intrinsic estimation delay which produces a computation that is "out of date". This is due to the fact that, in order to perform the cubic metric computation, samples of the composite signal x(k) must be collected over a certain time interval, which implies that there will need to have been some signal transmission before the appropriate PA backoff for that configuration can be applied. As a consequence, the backoff of the PA lags behind the actual signal characteristics requiring that backoff.

In the following embodiments of the present invention, this problem is solved by determining the cubic metric based only on the knowledge of the weighting factors β. This means the metric can be determined at an earlier stage, because the calculation can begin before the composite signal x(k) is produced (see FIG. 1). Preferably the calculation of the cubic metric is completed before the composite signal x(k) is supplied to the PA, allowing zero lag in the PA's backoff.

One way to determine the cubic metric using the weighting factors β would be to maintain a look-up table of predetermined cubic metric values, allowing the cubic metric to be looked-up for each combination of β values for the different channels.

This look-up method solves the above problem, but does have the disadvantage that there are typically a very large number of possible combinations of β values, for example in WCDMA Release 6 due to the possible use of:

15 possible values of the weighting factor $\beta_c$ for the DPCCH
  15 possible values of the weighting factor $\beta_d$ for the DPDCH(s)
  9 possible values of the weighting factor $\beta_{hs}$ for the HS-DPCCH
  9 possible values of the weighting factor $\beta_{ec}$ for the E-DPCCH
  30 possible values of the weighting factor $\beta_{ed}$ for the E-DP-DCH(s)

Given this disadvantage, a better solution is to compute the cubic metric analytically (as opposed to via a look-up table), using the values of β determined for the channels. The calculation is performed dynamically, i.e. "on the fly", by operating the transmitter to substitute the currently determined weighting factors values into an equation. An example of a preferred calculation is now described below.

First observe that the key to evaluating the cubic metric as defined above is the evaluation of the first term at the right-hand side of equation (1), $20 \log_{10}([V^3]_{rms})$, since the second term $20 \log_{10}([V_{ref}^3]_{rms})$ is a constant. Therefore, since $$20 \log_{10}([V^3]_{rms}) = 10 \log_{10}([V^3]_{rms}^2), \quad (3)$$

then it is only necessary to evaluate $$[V^3]_{rms}^2 = \frac{1}{M} \sum_m E\{|y_m(k)|^6\}, \quad (4)$$

where M is the oversampling factor, and $$y_m(k) = \sum_i x(k-i) g_m(i) \quad (5)$$

with $g_m(i)$ denoting the transmit filter impulse response, and $m = 0, 1, \ldots, M-1$ labelling the polyphase components. In WCDMA, the transmit filter is an RRC filter with roll-off 0.22.

In equation (5), x(k) represents the signal at the output of the processing block of FIG. 1, which is given by:

$$x(k) = \left[ \sum_{n=1}^{N_I} \beta_n^I d_n^I(k) + j \sum_{n=1}^{N_Q} \beta_n^Q d_n^Q(k) \right] \cdot s(k), \quad (6)$$

where
$d_n^I(k)$ denotes the spread data chips on the n-th in-phase channel
$d_n^Q(k)$ denotes the spread data chips on the n-th quadrature channel
$\beta_n^I$ and $\beta_n^Q$ denote the amplitude scaling factors, as illustrated in FIG. 1, and s(k) is the scrambling code sequence, defined in the 3GPP specification (TS 25.213) as $$s(k) = \frac{1}{\sqrt{2}} c_1(k)(1 + j(-1)^k c_2(2 \cdot \lfloor k/2 \rfloor)),$$

where $c_1(k)$ and $c_2(k)$ are pseudo random code sequences of terms, each of which can take the value +1 or −1.

Assuming that $\beta_n^I$ and $\beta_n^Q$ are normalised to ensure a unit energy spread sequence, then $$E\{|x(k)|^2\} = 1$$

For convenience, the following notation is introduced:

$$z(k) = \sum_{n=1}^{N_I} \beta_n^I d_n^I(k) + j \sum_{n=1}^{N_Q} \beta_n^Q d_n^Q(k). \quad (7)$$

Therefore, one has to evaluate the quantity $$E\{|y(k)|^6\} = \sum_{i_1} \sum_{i_2} \cdots \sum_{i_6} E\{z(i_1) z^*(i_2) z(i_3) z^*(i_4) z(i_5) z^*(i_6)\} \cdot E \quad (8)$$
$$\{s(i_1) s^*(i_2) s(i_3) s^*(i_4) s(i_5) s^*(i_6)\} \cdot g(k-i_1)$$
$$g(k-i_2) g(k-i_3) g(k-i_4) g(k-i_5) g(k-i_6).$$

A difficulty in calculating the above cubic metric is to find a closed-form expression for (8). The derivation can be simplified by noting the following points:

The moment of the scrambling code $E\{s(i_1) s^*(i_2) s(i_3) s^*(i_4) s(i_5) s^*(i_6)\}$ takes non-zero values in the following cases only:

$E\{s(i_1)s^*(i_2)s(i_3)s^*(i_4)s(i_5)s^*(i_6)\}=1$ for $(i_1=i_2, i_3=i_4, i_5=i_6)$, $(i_1=i_2, i_3=i_6, i_5=i_4)$, $(i_1=i_4, i_3=i_2, i_5=i_6)$, $(i_1=i_4, i_3=i_6, i_5=i_2)$, $(i_1=i_6, i_3=i_2, i_5=i_4)$ and $(i_1=i_6, i_3=i_4, i_5=i_2)$.

$E\{s(i_1)s^*(i_2)s(i_3)s^*(i_4)s(i_5)s^*(i_6)\}=-1$ for $(i_1=i_2, i_3=i_5=2l, i_4=i_6=i_3+1)$, $(i_1=i_2, i_4=i_6=2l, i_3=i_5=i_4+1)$, $(i_1=i_4, i_3=i_5=2l, i_2=i_6=i_3+1)$, $(i_1=i_4, i_2=i_6=2l, i_3=i_5=i_2+1)$, $(i_1=i_6, i_3=i_5=2l, i_2=i_4=i_3+1)$, $(i_1=i_6, i_2=i_4=2l, i_3=i_5=i_2+1)$, $(i_3=i_2, i_1=i_5=2l, i_4=i_6=i_1+1)$, $(i_3=i_2, i_4=i_6=2l, i_1=i_5=i_4+1)$, $(i_3=i_4, i_1=i_5=2l, i_2=i_6=i_1+1)$, $(i_3=i_4, i_2=i_6=2l, i_1=i_5=i_2+1)$, $(i_3=i_6, i_1=i_5=2l, i_2=i_4=i_1+1)$, $(i_3=i_6, i_2=i_4=2l, i_1=i_5=i_2+1)$, $(i_5=i_2, i_3=i_1=2l, i_4=i_6=i_3+1)$, $(i_5=i_2, i_4=i_6=2l, i_3=i_1=i_4+1)$, $(i_5=i_4, i_3=i_1=2l, i_2=i_6=i_3+1)$, $(i_5=i_4, i_2=i_6=2l, i_3=i_1=i_2+1)$, $(i_5=i_6, i_3=i_1=2l, i_2=i_4=i_3+1)$ and $(i_5=i_6, i_2=i_4=2l, i_3=i_5=+1)$.

For these cases where the scrambling code moment $E\{s(i_1)s^*(i_2)s(i_3)s^*(i_4)s(i_5)s^*(i_6)\}$ is non-zero, the spread sequence moment $E\{z(i_1)z^*(i_2)z(i_3)z^*(i_4)z(i_5)z^*(i_6)\}$ is calculated by taking in account the OVSF spreading codes and exploiting the non-correlation of the transmitted data symbols where appropriate.

(For information on moments, see "Probability, Random Variables, and Stochastic Processes", A Papoulis, New York: McGraw-Hill, $3^{rd}$ Edition, 1991, page 316, paragraph on "general moments").

First estimation of the cubic metric (ignoring correlation properties resulting from the OVSF spreading codes) is given by:

$$[V^3]_{rms}^2 \approx (A_6 - 9A_4B_2 + 12B_2^3)G_6 + (9A_4B_2 - 18B_2^3)G_4 + 6B_2^3 G_2 = E_1 \quad (9)$$

where $$G_6 = \frac{1}{M} \sum_m \sum_i g_m^6(i),$$

and similarly $$G_4 = \frac{1}{M} \sum_m \left(\sum_i g_m^4(i)\right)\left(\sum_i g_m^2(i)\right)$$

$$G_2 = \frac{1}{M} \sum_r \left(\sum_i g_m^2(i)\right)^3.$$

In practice, for an accurate calculation it is enough to use an oversampling factor of M=4, which leads to $$G_6 = 0.7280, G_4 = 0.8177, G_2 = 1.0292.$$

The quantities $A_4$ and $A_6$ in equation (9) are given by:

$$A_4 = 3B_2^2 - 2B_4 - 4B_2^I \cdot B_2^Q$$

$$A_6 = 16B_6 - 18B_2 \cdot B_4 + 6B_2^3 - 12(B_4^Q - B_4^I)\cdot(B_2^Q - B_2^I) + 9B_2 \cdot (B_2^Q - B_2^I)^2,$$

where $$B_2^I = \sum_{i=1}^{N_I} (\beta_i^I)^2, \quad B_2^Q = \sum_{i=1}^{N_Q} (\beta_i^Q)^2$$

$$B_4^I = \sum_{i=1}^{N_I} (\beta_i^I)^4, \quad B_4^Q = \sum_{i=1}^{N_Q} (\beta_i^Q)^4$$

$$B_6^I = \sum_{i=1}^{N_I} (\beta_i^I)^6, \quad B_6^Q = \sum_{i=1}^{N_Q} (\beta_i^Q)^6$$

and $$B_2 = B_2^I + B_2^Q$$

$$B_4 = B_4^I + B_4^Q$$

$$B_6 = B_6^I + B_6^Q.$$

Note that in the equations above, the values of the weighting factors β are the only variables, and so in the above embodiment the calculation of the cubic metric can be said in this sense to be based purely on the weighting factors. For a given realisation of the system, the impulse response and oversampling factor are fixed—for the purposes of the calculation above, if any adequate oversampling factor is used, e.g. M=4, and a reasonably accurate RRC impulse response, then an accurate enough cubic metric can be computed.

It is also possible to improve the precision of the cubic metric value calculated above by using information on the spreading codes of the channels, preferably by taking into account the correlation properties of the OVSF codes used to spread the data. An example is as follows.

Taking into account the correlation of the OVSF codes results in an additional term $E_2$ in equation (9):

$$[V^3]_{rms}^2 \approx E_1 + E_2. \quad (10)$$

To calculate the term $E_2$, two quantities $R_{C_1,C_2}^{(1)}(l,r)$ and $R_{C_1,C_2,C_3}^{(2)}(l)$ are defined. The first quantity is $$R_{C_1,C_2}^{(1)}(\ell, r) = \frac{2}{SF} \sum_{k=0}^{SF/2-1} \rho(\ell, k_1, k_2),$$

where $$\rho(\ell, k_1, k_2) = \begin{cases} C_1(k_1)C_1(k_1+\ell)C_2(k_2)C_2(k_2+\ell) & \begin{array}{l} \text{for } 1 \leq k_1+\ell \leq SF_1, \\ 1 \leq k_2+\ell \leq SF_2 \end{array} \\ 0 & \text{otherwise} \end{cases}$$

and r=1 or 2, $SF_1$ and $SF_2$ are the spreading factors of codes $C_1$ and $C_2$, SF is the maximum spreading factor SF=max(SF$_1$, SF$_2$), and the indexes $k_1$ and $k_2$ are defined as $$k_1 = \mod(2k+r-1, SF_1)+1, k_2 = \mod(2k+r-1, SF_2)+1.$$

The second quantity is defined as:

$$R_{C_1,C_2,C_3}^{(2)}(\ell) = \frac{2}{SF} \sum_{k=1}^{SF} [\rho'(\ell, k_1, k_2, k_3) + \rho''(\ell, k_1, k_2, k_3)],$$

where $$\rho'(\ell, k_1, k_2, k_3) =$$

$$\begin{cases} C_1(k_1)C_1(k_1+1)C_2(k_2)C_2(k_2+\ell+1) & \text{for } k_1+1 \leq SF_1, \\ C_3(k_3+1)C_3(k_3+\ell+1) & 1 \leq k_2+\ell+1 \leq SF_2, \\ & k_3+1 \leq SF_3, \\ & 1 \leq k_3+\ell+1 \leq SF_3 \\ 0 & \text{otherwise} \end{cases}$$

-continued $$\rho''(\ell, k_1, k_2, k_3) = \begin{cases} C_1(k_1)C_1(k_1+1)C_2(k_2+1)C_2(k_2+\ell+1) & \text{for } k_1+1 \leq SF_1, \\ & k_2+1 \leq SF_2, \\ C_3(k_3)C_3(k_3+\ell+1) & k_2+\ell+1 \leq SF_2, \\ & 1 \leq k_3+\ell+1 \leq SF_3 \\ 0 & \text{otherwise} \end{cases}$$

$SF=\max(SF_1, SF_2, SF_3)$, and the indexes $k_1$, $k_2$ and $k_3$ are defined as:

$k_1=\mod(k-1,SF_1)+1, k_2=\mod(k-1,SF_2)+1, k_3=\mod(k-1,SF_3)+1$.

The following functions are then defined:

$$\alpha_r^I(\ell) = 4 \sum_{n_1 < n_2} \left(\beta_{n_1}^I \beta_{n_2}^I\right)^2 R^{(1)}_{C^I_{n_1}, C^I_{n_2}}(\ell, r),$$
$r = 1, 2$ $$\alpha_r^Q(\ell) = 4 \sum_{n_1 < n_2} \left(\beta_{n_1}^Q \beta_{n_2}^Q\right)^2 R^{(1)}_{C^Q_{n_1}, C^Q_{n_2}}(\ell, r),$$
$r = 1, 2$ $$\gamma^I(\ell) = B_2^I \sum_{n_1, n_2} \left(\beta_{n_1}^Q \beta_{n_2}^Q\right)^2 R^{(1)}_{C^Q_{n_1}, C^Q_{n_2}}(1, 1) + 2 \sum_{n_1} \sum_{n_2 < n_3} \left(\beta_{n_1}^Q \beta_{n_2}^I \beta_{n_3}^I\right)^2 R^{(2)}_{C^Q_{n_1}, C^I_{n_2}, C^I_{n_3}}(\ell)$$

$$\gamma^Q(\ell) = B_2^Q \sum_{n_1, n_2} \left(\beta_{n_1}^I \beta_{n_2}^I\right)^2 R^{(1)}_{C^I_{n_1}, C^I_{n_2}}(1, 1) + 2 \sum_{n_1} \sum_{n_2 < n_3} \left(\beta_{n_1}^I \beta_{n_2}^Q \beta_{n_3}^Q\right)^2 R^{(2)}_{C^I_{n_1}, C^Q_{n_2}, C^Q_{n_3}}(\ell)$$

and further are defined:

$$\alpha(\ell) = \frac{1}{2}\left(\alpha_1^I(\ell) + \alpha_2^I(\ell) + \alpha_1^Q(\ell) + \alpha_2^Q(\ell)\right)$$

$$\eta(\ell) = D + \left(B_2^{Q^2} - B_2^{I^2}\right)\left(\alpha_2^Q(2) - \alpha_2^I(2) + \alpha_2^Q(1) - \alpha_2^I(1)\right) + 4(\gamma^I(\ell) + \gamma^Q(\ell)),$$

where:

$D=(B_2^Q-B_2^I)(B_2^{Q^2}-B_2^{I^2})+B_2(\alpha_1^Q(1)+\alpha_1^I(1))$.

The additional term $E_2$ can therefore be written as:

$$E_2 = \frac{9B_2}{M} \sum_m \sum_{i_1 \neq i_2} g_m^4(i_1)g_m^2(i_2)\alpha(i_1 - i_2) +$$

$$\frac{6B_2}{M} \sum_m \sum_{\substack{i_1 \neq i_2 \\ i_1 \neq i_3}} g_m^2(i_1)g_m^2(i_2)g_m^2(i_3)(\alpha(i_1 - i_2) + \alpha(i_1 - i_3) + \alpha(i_2 - i_3)) +$$

$$\frac{6}{M} \sum_m \sum_{i_1} g_m^2(i_1)g_m^2(i_1 - 1)(\eta(0)g_m^2(i_1) + \eta(-1)g_m^2(i_1)) -$$

$$\frac{9}{M} \sum_m \sum_{i_1, i_2} g_m^2(i_1)g_m^2(i_1 - 1)g_m^2(i_2)\eta(i_2 - i_1).$$

Thus the above gives an example of how the calculation of the metric can be refined by including information on the spreading codes of the channels.

The following Table 1 shows the experimental cubic metric and the calculated one using the refined formula (10) for different uplink configurations according to the WCDMA FDD Release 6 specifications. In the table, 'Br' indicates the transmission of the physical channel on the in-phase or quadrature branch, and 'C' refers to the OVSF code index. For the different physical channels, BPSK modulation is indicated in Table 1 by allocation of either the in-phase (I) or the quadrature (Q) branch, whereas QPSK modulation is indicated by allocation of both the in-phase and quadrature branches (I+Q).

The results show that the calculated cubic metric predicts well the measured cubic metric, with a mismatch between the measured and the calculated values of less than 0.02 dB.

TABLE 1

Measured and calculated cubic metric (before the CEIL(·) operation of equation (1)) for different uplink configurations:

| | DPCCH | | | | DPDCH | | | | E-DPDCH | | | | HS-DPCCH | | | | E-DPCCH | | | | Measured | Calculated |
|---|---|---|---|---|---|---|---|---|---|---|---|---|---|---|---|---|---|---|---|---|---|---|
| Test | Br | β | SF | C | Br | β | SF | C | Br | β | SF | C | Br | β | SF | C | Br | β | SF | C | CM (dB) | CM (dB) |
| A | Q | 8 | 256 | 0 | I | 15 | 64 | 16 | | | | | | | | | | | | | 0.00 | 0.00 |
| B | Q | 15 | 256 | 0 | | | | | I | 67 | 4 | 1 | Q | 15 | 256 | 33 | I | 24 | 256 | 1 | 1.12 | 1.13 |
| C | Q | 15 | 256 | 0 | | | | | I+Q | 7 | 4 | 1 | Q | 15 | 256 | 33 | I | 5 | 256 | 1 | 2.68 | 2.69 |
| D | Q | 15 | 256 | 0 | | | | | I+Q | 15 | 4 | 1 | Q | 15 | 256 | 33 | I | 8 | 256 | 1 | 2.27 | 2.29 |
| E | Q | 15 | 256 | 0 | | | | | I | 21 | 64 | 16 | Q | 15 | 256 | 33 | I | 15 | 256 | 1 | 1.39 | 1.39 |
| F | Q | 15 | 256 | 0 | I | 15 | 64 | 16 | I | 60 | 4 | 2 | Q | 15 | 256 | 64 | I | 15 | 256 | 1 | 1.58 | 1.59 |
| G | Q | 15 | 256 | 0 | I | 15 | 64 | 16 | I+Q | 168 | 2 | 1 | Q | 5 | 256 | 64 | I | 9 | 256 | 1 | 0.15 | 0.15 |

Figure 2:
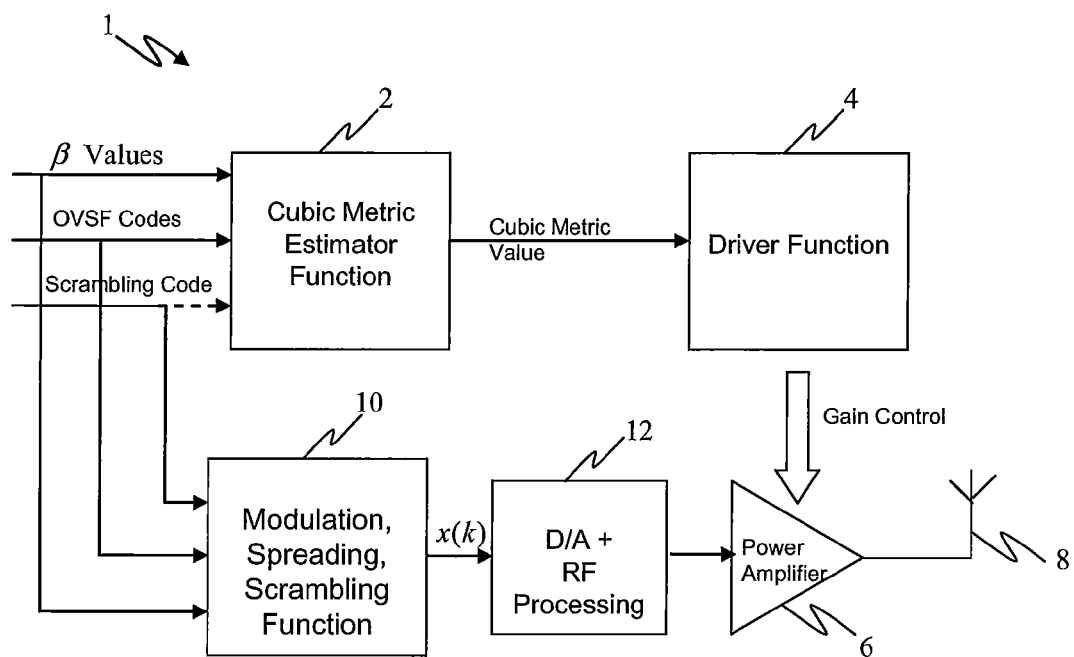
FIG. 2 is a schematic block diagram of a transmitter incorporating means for estimating the cubic metric and controlling transmission based thereon.

FIG. 2 shows a possible implementation of the functionality according to an embodiment of the present invention. This shows, schematically, a transmitter 1 comprising: a cubic metric estimator function 2; a driver function 4; a power amplifier 6; at least one antenna 8; a modulation, spreading and scrambling function 10; and a digital-to-analogue (D/A) and radio frequency (RF) processing block 12. Each of the cubic metric estimator function 2 and the modulation, spreading and scrambling function 10 is arranged to receive the scrambling code, OVSF spreading codes and set of weighting factors which are currently to be used in the production of the transmitted data. The cubic metric estimator function 2 is operatively coupled to the driver function 4, and is arranged to supply a cubic metric value to the driver function 4. The driver function 4 is operatively coupled to the power amplifier 6 and arranged to supply a gain control indication to a control input of the power amplifier 6. The modulation, spreading and scrambling function 10 is operatively coupled to a digital input of the D/A+RF processing block 12, and is arranged to supply the composite signal x(k) to the digital input of the D/A+RF processing block 12. The D/A+RF processing block 12 has an analogue output operatively coupled to a signal input of the power amplifier 6, is arranged to supply an analogue signal from its analogue output to the signal input of the power amplifier 6. The power amplifier 6 has a signal output operatively coupled to the antenna 8 for broadcasting the signal wirelessly, preferably across a wireless cellular network.

In a preferred implementation, the transmitter 1 is configured as a soft-modern type transmitter, with each of the cubic metric estimator function 2; the driver function 4; and the modulation, spreading and scrambling function 10 being implemented in software stored on a memory of the transmitter 1 and executed on a processor of the transmitter 1. Particularly, the cubic estimator function is implemented by executing arithmetic instructions on the central processing unit (CPU) to dynamically calculate the metric in the CPU itself, rather than looking up the metric from a look-up table in a memory. The D/A+RF processing block 12 and power amplifier 6 are preferably implemented in dedicated hardware.

In operation, the same scrambling code, OVSF spreading codes and set of β values which are currently being used in the production of the transmitted data are provided to the cubic metric estimator function 2. This function computes the cubic metric in the manner described above. The cubic metric is then passed to the driver function 4, which uses it to compute gain control information (maximum power reduction) for the Power Amplifier. The process is timed so that the gain control information corresponding to the current set of β values, scrambling code and OVSF spreading codes is used.

It will be appreciated that the above embodiments are described only by way of example.

In one alternative embodiment, instead of (or in addition to) backing off the power of the power amplifier based on the estimated cubic metric, this metric could be used to make scheduling decisions. For example, in the case of 3GPP WCDMA uplink transmission, if the estimated cubic metric is too high, meaning that the power amplifier will behave non-linearly and adversely affect the quality of transmission, then (if the protocols were enhanced to support it) this information could be provided to the base station (which also may be referred to as Node B in WCDMA terminology) scheduler, where it could be used for scheduling decisions. Note that this possibility is advantageously enabled by the present invention, because the metric is estimated using the weighting factors instead of the composite signal—thus a decision about scheduling a particular channel can be made before that channel is actually scheduled for inclusion in the composite signal. If the metric was based on the composite signal, then it would be too late to influence the scheduling decision.

Note that although the above has been described in terms of the cubic metric being determined based on a particular calculation, in other embodiments other forms of calculation could be used to determine the cubic metric, or metrics other than the cubic metric could be used, representing the signal characteristics related to the operation of the power amplifier. For example, the metric may comprise an indication of the peak-to average power ratio calculated from the weighting factors. In general, the invention may use any suitable metric computed from weighting factors to estimate the signal characteristics, as opposed to directly using the composite signal to be transmitted, because this advantageously allows the metric to be estimated at an earlier stage and may reduce the estimation lag, and hence the problem of producing an estimate which is "out of date", whilst at the same time avoiding the need for a look-up table of weighting factors. Other estimations of the cubic metric or other metrics could be used to exploit this idea, and may be apparent to a person skilled in the art given the disclosure herein.

Further, additional or alternative equations for refining the calculation using the spreading and/or scrambling codes may be used, preferably taking into account the correlation properties and/or moments of the codes. Further, the present invention is not limited to the use of weighting factors for any particular type or combination of channels on the transmitter branches, nor particularly to any one standard such as the 3GPP WCDMA/High Speed Packet Access (HSPA) standard. The principle of the invention can apply to any system in which channels are to be combined in a manner which might affect the possibility of operating in the linear region of the characteristic of the power-amplifier. For example, the principle of the invention also applies to the 3GPP High Speed Uplink Packet Access (HSUPA) standard evolution. Further, the invention may be implemented in other ways than the particular soft-modern arrangement shown in FIG. 2. Any other implementation could be used, ranging from a pure hardware implementation to a complete software implementation. Further, although the above has been described in relation to the transmitter of a user equipment (e.g. a mobile terminal such as a mobile phone), the invention may be used in any type of transmitter, with reference to a signal metric suitable for any other network element such as for example a base station (also referred to as Node B in WCDMA terminology).

Other applications and configurations of the invention may be apparent to the person skilled in the art given the disclosure herein. The scope of the invention is not limited by the described embodiments.

The invention claimed is:

1. A method of transmitting an RF signal over a wireless communication network, the method comprising:
   determining a respective weighting factor for each of a plurality of digital signals each corresponding to a respective channel, the weighting factors being for weighting the digital signals for combination to produce a composite signal intended for transmission as an RF signal via a power amplifier;
   executing instructions on a processor to dynamically calculate, in the processor, a metric related to the non-linearity of the power amplifier's transfer characteristics for the composite signal using the determined weighting factors;
   supplying to the power amplifier a signal for transmission as an RF signal;
   amplifying the signal for transmission at the power amplifier to transmit an RF signal over the wireless communication network via at least one antenna; and
   controlling the transmission based on said metric related to the amplifier non-linearity;
   wherein said communication network operates according to a set of scrambling codes, and the processor is programmed to perform said dynamic calculation by dynamically evaluating an expression that comprises moments of some combinations of the scrambling codes.

2. A method according to claim 1, wherein said communication network operates according to a set of scrambling codes, and said dynamic calculation comprises dynamically evaluating an expression that comprises moments of some combinations of the scrambling codes.

3. A method according to claim 1, wherein said channels comprise different physical channels, and said dynamic calculation comprises dynamically evaluating an expression that comprises transmit filter coefficients and the weighting factors of the different physical channels.

4. A method according to claim 1, wherein said communication network operates according to a set of spreading codes, and said dynamic calculation comprises dynamically evaluating an expression in which one or more quantities depending on a correlation of some combinations of said spreading codes are predetermined to be negligible.

5. A method according to claim 1, wherein said communication network operates according to a set of spreading codes, and said dynamic calculation comprises using information concerning the spreading codes of said channels.

6. A method according to any preceding claim, wherein said dynamic calculation comprises using information relating to a correlation property of the spreading codes.

7. A method according to claim 1, wherein:
the method comprises producing the composite signal by combining said digital signals weighted by the respective weighting factors;
the supplying of the signal for transmission comprises supplying the composite signal to the power amplifier for transmission as an RF signal; and
the controlling of the transmission comprises backing off the power of the power amplifier based on said metric related to the amplifier non-linearity.

8. A method according to claim 1, wherein:
the controlling of the transmission comprises making a decision regarding scheduling of said channels based on said metric related to the amplifier non-linearity, thus producing an alternative composite signal; and
the supplying of the signal for transmission comprises supplying the alternative composite signal to the power amplifier for transmission as an RF signal.

9. A method according to claim 1, wherein the transmission is a CDMA transmission, and each of said channels corresponds to a respective combination of spreading code, scrambling code and frequency.

10. A method according to claim 9, wherein the transmission is a WCDMA transmission.

11. A method according to claim 1, wherein said calculation of a metric related to the amplifier non-linearity comprises calculating a cubic metric.

12. A method according to claim 1, wherein: said channels comprise different physical channels; and said dynamic calculation of the metric comprises dynamically evaluating a first term depending on quantities given by sums of powers of the weighting factors of different physical channels applied to an in-phase branch or to a quadrature branch, and on quantities that are function of sums of powers of the samples of a transmit filter impulse response.

13. A method according to claim 12, where said first tennis substantially equal to:

$$(A_6 - 9A_4 B_2 + 12 B_2^3) G_6 + (9 A_4 B_2 - 18 B_2^3) G_4 + 6 B_2^3 G_2$$

where $G_2$, $G_4$ and $G_6$ are constants; and:

$$A_4 = 3 B_2^2 - 2 B_4 - 4 B_2^I \cdot B_2^Q,$$

$$A_6 = 16 B_6 - 18 B_2 \cdot B_4 + 6 B_2^3 - 12(B_4^Q - B_4^I) \cdot (B_2^Q - B_2^I) + 9 B_2 \cdot (B_2^Q - B_2^I)^2,$$

and:

$$B_2^I = \sum_{i=1}^{N_I} (\beta_i^I)^2, \quad B_2^Q = \sum_{i=1}^{N_Q} (\beta_i^Q)^2$$

$$B_4^I = \sum_{i=1}^{N_I} (\beta_i^I)^4, \quad B_4^Q = \sum_{i=1}^{N_Q} (\beta_i^Q)^4$$

$$B_6^I = \sum_{i=1}^{N_I} (\beta_i^I)^6, \quad B_6^Q = \sum_{i=1}^{N_Q} (\beta_i^Q)^6;$$

where $B_i^I$ is the weighting factor of an $i^{th}$ one of $N_I$ of said channels applied on an in-phase branch, and $\beta_i^Q$ is the weighting factor of an $i^{th}$ one of $N_Q$ of said channels applied on a quadrature branch; and:

$$B_2 = B_2^I + B_2^Q$$

$$B_4 = B_4^I + B_4^Q$$

$$B_6 = B_6^I + B_6^Q.$$

14. The method of claim 13, wherein:

$$G_6 = \frac{1}{M} \sum_m \sum_i g_m^6(i),$$

and $$G_4 = \frac{1}{M} \sum_m \left( \sum_i g_m^4(i) \right) \left( \sum_i g_m^2(i) \right),$$

and $$G_2 = \frac{1}{M} \sum_r \left( \sum_i g_m^2(i) \right)^3;$$

where $g_m(i)$ denotes an impulse response of a transmit filter used to transmit said signal, and $m=0, 1, \ldots, M-1$ labels M polyphase components.

15. The method of claim 12, wherein said dynamic calculation of the metric comprises dynamically evaluating a second term depending on quantities that are function of powers of samples of a transmit filter impulse response; and adding the second term to the first term.

16. A method according to claim 15, where said second term is substantially equal to:

$$\frac{9 B_2}{M} \sum_m \sum_{i_1 \neq i_2} g_m^4(i_1) g_m^2(i_2) \alpha(i_1 - i_2) +$$

$$\frac{6 B_2}{M} \sum_m \sum_{\substack{i_1 \neq i_2 \\ i_1 \neq i_3}} g_m^2(i_1) g_m^2(i_2) g_m^2(i_3) (\alpha(i_1 - i_2) + \alpha(i_1 - i_3) + \alpha(i_2 - i_3)) +$$

$$\frac{6}{M} \sum_m \sum_{i_1} g_m^2(i_1) g_m^2(i_1 - 1)(\eta(0) g_m^2(i_1) + \eta(-1) g_m^2(i_1)) -$$

-continued $$\frac{9}{M}\sum_{m}\sum_{i_1,i_2} g_m^2(i_1)g_m^2(i_1-1)g_m^2(i_2)\eta(i_2-i_1);$$

where $g_m(i)$ denotes an impulse response of a transmit filter used to transmit said signal, and m=0, 1, ..., M−1 labels M polyphase components; and:

$$\alpha_r^I(\ell) = 4\sum_{n_1<n_2}(\beta_{n_1}^I\beta_{n_2}^I)^2 R_{C_{n_1}^I,C_{n_2}^I}^{(1)}(\ell,r),$$

$r = 1, 2$ $$\alpha_r^Q(\ell) = 4\sum_{n_1<n_2}(\beta_{n_1}^Q\beta_{n_2}^Q)^2 R_{C_{n_1}^Q,C_{n_2}^Q}^{(1)}(\ell,r),$$

$r = 1, 2$ $$\gamma^I(\ell) = B_2^I \sum_{n_1,n_2}(\beta_{n_1}^Q\beta_{n_2}^I)^2 R_{C_{n_1}^Q,C_{n_2}^Q}^{(1)}(1,1) +$$

$$2\sum_{n_1}\sum_{n_2<n_3}(\beta_{n_1}^Q\beta_{n_2}^I\beta_{n_3}^I)^2 R_{C_{n_1}^Q,C_{n_2}^I,C_{n_3}^I}^{(2)}(\ell)$$

$$\gamma^Q(\ell) = B_2^Q \sum_{n_1,n_2}(\beta_{n_1}^I\beta_{n_2}^Q)^2 R_{C_{n_1}^I,C_{n_2}^I}^{(1)}(1,1) +$$

$$2\sum_{n_1}\sum_{n_2<n_3}(\beta_{n_1}^I\beta_{n_2}^Q\beta_{n_3}^Q)^2 R_{C_{n_1}^I,C_{n_2}^Q,C_{n_3}^Q}^{(2)}(\ell)$$

and $$\alpha(\ell) = \frac{1}{2}(\alpha_1^I(\ell) + \alpha_2^I(\ell) + \alpha_1^Q(\ell) + \alpha_2^Q(\ell))$$

$\eta(\ell) =$ $$D + (B_2^{Q^2} - B_2^{I^2})(\alpha_2^Q(2) - \alpha_2^I(2) + \alpha_2^Q(1) - \alpha_2^I(1)) + 4(\gamma^I(\ell) + \gamma^Q(\ell)),$$

and $$D = (B_2^Q - B_2^I)(B_2^{Q^2} - B_2^{I^2}) + B_2(\alpha_1^Q(1) + \alpha_1^I(1)).$$

17. A transmitter for transmitting an RF signal over a wireless communication network comprising:
a power amplifier arranged to amplify its input for transmission of an RF signal over the wireless communication network via at least one antenna;
a processor operatively coupled to the power amplifier, the processor being programmed to:
determine a respective weighting factor for each of a plurality of digital signals each corresponding to a respective channel;
combine said digital signals weighted by said weighting factors to produce a composite signal for supply to the input of said power amplifier;
dynamically calculate a metric related to the non-linearity of the power amplifier's transfer characteristics for the composite signal using the determined weighting factors; and
control the transmission based on said metric related to the amplifier non-linearity;
wherein said communication network operates according to a set of scrambling codes, and the processor is programmed to perform said dynamic calculation by dynamically evaluating an expression that comprises moments of some combinations of the scrambling codes.

18. A transmitter according to claim 17, wherein said communication network operates according to a set of scrambling codes, and said dynamic calculation comprises dynamically evaluating an expression in which moments of at least some combinations of said scrambling codes are predetermined to be negligible.

19. A transmitter according to claim 17, wherein said channels comprise different physical channels, and the processor is programmed to perform said dynamic calculation by dynamically evaluating an expression that comprises transmit filter coefficients and the weighting factors of the different physical channels.

20. A transmitter according to claim 17, wherein said communication network operates according to a set of spreading codes, and the processor is programmed to perform said dynamic calculation by dynamically evaluating an expression in which one or more quantities depending on a correlation of some combinations of said spreading codes are predetermined to be negligible.

21. A transmitter according to claim 17, wherein said communication network operates according to a set of spreading codes, and the processor is programmed to perform said dynamic calculation using information concerning the spreading codes of said channels.

22. A transmitter according to claim 17, wherein the processor is programmed to perform said dynamic calculation using information relating to a correlation property of the spreading codes.

23. A transmitter according to claim 17, wherein:
the processor is programmed to produce the composite signal by combining said digital signals weighted by the respective weighting factors;
the processor is programmed to supply the signal for transmission by supplying the composite signal from the processor to the power amplifier for transmission as an RF signal; and
the processor is programmed to control the transmission by backing off the power of the power amplifier based on said metric related to the amplifier non-linearity.

24. A transmitter according to claim 17, wherein:
the processor is programmed to control the transmission by making a decision regarding scheduling of said channels based on said metric related to the amplifier non-linearity, thus producing an alternative composite signal; and
the processor is programmed to supply the signal for transmission by supplying the alternative composite signal from the processor to the power amplifier for transmission as an RF signal.

25. A transmitter according to claim 17, wherein the transmitter is a CDMA transmitter, and each of said channels corresponds to a respective combination of spreading code, scrambling code and frequency.

26. A transmitter according to claim 25, wherein the transmitter is a WCDMA transmitter.

27. A transmitter according to claim 17, wherein the processor is programmed to calculate said metric related to the amplifier non-linearity as a cubic metric.

28. A transmitter according to claim 17, wherein: said channels comprise different physical channels; and the processor is programmed to perform said dynamic calculation of the metric by dynamically evaluating a first term depending on quantities given by sums of powers of the weighting factors of the different physical channels applied to an in-phase branch or to a quadrature branch, and on quantities that are function of sums of powers of the samples of a transmit filter impulse response.

29. A transmitter according to claim 28, where said first term is substantially equal to:

$$(A_6 - 9A_4B_2 + 12B_2^3)G_6 + (9A_4B_2 - 18B_2^3)G_4 + 6B_2^3 G_2$$

where $G_2$, $G_4$ and $G_6$ are constants; and:

$$A_4 = 3B_2^2 - 2B_4 - 4B_2^I \cdot B_2^Q,$$

$$A_6 = 16B_6 - 18B_2 \cdot B_4 + 6B_2^3 - 12(B_4^Q - B_4^I) \cdot (B_2^Q - B_2^I) + 9B_2 \cdot (B_2^Q - B_2^I)^2,$$

and:

$$B_2^I = \sum_{i=1}^{N_I} (\beta_i^I)^2, \quad B_2^Q = \sum_{i=1}^{N_Q} (\beta_i^Q)^2$$

$$B_4^I = \sum_{i=1}^{N_I} (\beta_i^I)^4, \quad B_4^Q = \sum_{i=1}^{N_Q} (\beta_i^Q)^4$$

$$B_6^I = \sum_{i=1}^{N_I} (\beta_i^I)^6, \quad B_6^Q = \sum_{i=1}^{N_Q} (\beta_i^Q)^6;$$

where $B_i^I$ is the weighting factor of an $i^{th}$ one of $N_I$ of said channels applied on an in-phase branch, and $\beta_i^Q$ is the weighting factor of an one of $N_Q$ of said channels applied on a quadrature branch; and:

$$B_2 = B_2^I + B_2^Q$$

$$B_4 = B_4^I + B_4^Q$$

$$B_6 = B_6^I + B_6^Q.$$

30. A transmitter according to claim 29, wherein:

$$G_6 = \frac{1}{M} \sum_m \sum_i g_m^6(i),$$

and $$G_4 = \frac{1}{M} \sum_m \left( \sum_i g_m^4(i) \right) \left( \sum_i g_m^2(i) \right),$$

and $$G_2 = \frac{1}{M} \sum_r \left( \sum_i g_m^2(i) \right)^3;$$

where $g_m(i)$ denotes an impulse response of a transmit filter used to transmit said signal, and $m=0, 1, \ldots, M-1$ labels M polyphase components.

31. A transmitter according to claim 28, wherein said dynamic calculation of the metric comprises dynamically evaluating a second term depending on quantities that are function of powers of samples of a transmit filter impulse response; and adding the second term to the first term.

32. A transmitter according to claim 31, where said second term is substantially equal to:

$$\frac{9B_2}{M} \sum_m \sum_{i_1 \neq i_2} g_m^4(i_1) g_m^2(i_2) \alpha(i_1 - i_2) +$$

-continued $$\frac{6B_2}{M} \sum_m \sum_{\substack{i_1 \neq i_2 \\ i_1 \neq i_3}} g_m^2(i_1) g_m^2(i_2) g_m^2(i_3) (\alpha(i_1 - i_2) + \alpha(i_1 - i_3) + \alpha(i_2 - i_3)) +$$

$$\frac{6}{M} \sum_m \sum_{i_1} g_m^2(i_1) g_m^2(i_1 - 1)(\eta(0) g_m^2(i_1) + \eta(-1) g_m^2(i_1)) -$$

$$\frac{9}{M} \sum_m \sum_{i_1, i_2} g_m^2(i_1) g_m^2(i_1 - 1) g_m^2(i_2) \eta(i_2 - i_1);$$

where $g_m(i)$ denotes an impulse response of a transmit filter used to transmit said signal, and $m=0, 1, \ldots, M-1$ labels M polyphase components; and:

$$\alpha_r^I(\ell) = 4 \sum_{n_1 < n_2} (\beta_{n_1}^I \beta_{n_2}^I)^2 R^{(1)}_{C_{n_1}^I, C_{n_2}^I}(\ell, r),$$

$$r = 1, 2$$

$$\alpha_r^Q(\ell) = 4 \sum_{n_1 < n_2} (\beta_{n_1}^Q \beta_{n_2}^Q)^2 R^{(1)}_{C_{n_1}^Q, C_{n_2}^Q}(\ell, r),$$

$$r = 1, 2$$

$$\gamma^I(\ell) = B_2^Q \sum_{n_1, n_2} (\beta_{n_1}^Q \beta_{n_2}^I)^2 R^{(1)}_{C_{n_1}^Q, C_{n_2}^I}(1, 1) +$$

$$2 \sum_{n_1} \sum_{n_2 < n_3} (\beta_{n_1}^Q \beta_{n_2}^I \beta_{n_3}^I)^2 R^{(2)}_{C_{n_1}^I, C_{n_2}^I, C_{n_3}^I}(\ell)$$

$$\gamma^Q(\ell) = B_2^Q \sum_{n_1, n_2} (\beta_{n_1}^I \beta_{n_2}^Q)^2 R^{(1)}_{C_{n_1}^I, C_{n_2}^Q}(1, 1) +$$

$$2 \sum_{n_1} \sum_{n_2 < n_3} (\beta_{n_1}^I \beta_{n_2}^Q \beta_{n_3}^Q)^2 R^{(2)}_{C_{n_1}^I, C_{n_2}^Q, C_{n_3}^Q}(\ell)$$

and $$\alpha(\ell) = \frac{1}{2} (\alpha_1^I(\ell) + \alpha_2^I(\ell) + \alpha_1^Q(\ell) + \alpha_2^Q(\ell))$$

$$\eta(\ell) =$$

$$D + (B_2^{Q^2} - B_2^{I^2})(\alpha_2^Q(2) - \alpha_2^I(2) + \alpha_2^Q(1) - \alpha_2^I(1)) + 4(\gamma^I(\ell) + \gamma^Q(\ell)),$$

and $$D = (B_2^Q - B_2^I)(B_2^{Q^2} - B_2^{I^2}) + B_2(\alpha_1^Q(1) + \alpha_1^I(1)).$$

33. A computer program product embodied on a non-transitory computer readable medium for transmitting an RF signal over a wireless communication network, the program comprising code which when executed on a processor will perform the steps of:
  determining a respective weighting factor for each of a plurality of digital signals each corresponding to a respective channel, the weighting factors being for weighting the digital signals for combination to produce a composite signal intended for transmission as an RF signal via a power amplifier;
  dynamically calculating, in the processor, a metric related to the non-linearity of the power amplifier's transfer characteristics for the composite signal using the determined weighting factors;
  supplying from the processor to the power amplifier a signal for transmission as an RF signal;
  amplifying the signal for transmission at the power amplifier to transmit an RF signal over the wireless communication network via at least one antenna; and controlling the transmission based on said metric related to the amplifier non-linearity:

wherein said communication network operates according to a set of scrambling codes, and the processor is programmed to perform said dynamic calculation by dynamically evaluating an expression that comprises moments of some combinations of the scrambling codes.

34. A user equipment for transmitting an RF signal over a wireless communication network comprising:

a power amplifier arranged to amplify its input for transmission of an RF signal over the wireless communication network via at least one antenna;

a processor operatively coupled to the power amplifier, the processor being programmed to:

determine a respective weighting factor for each of a plurality of digital signals each corresponding to a respective channel;

combine said digital signals weighted by said weighting factors to produce a composite signal for supply to the input of said power amplifier;

dynamically calculate a metric related to the non-linearity of the power amplifier's transfer characteristics for the composite signal using the determined weighting factors; and control the transmission based on said metric related to the amplifier non-linearity;

wherein said communication network operates according to a set of scrambling codes, and the processor is programmed to perform said dynamic calculation by dynamically evaluating an expression that comprises moments of some combinations of the scrambling codes.

35. A wireless communication system comprising a plurality of base stations and a mobile terminal for transmitting RF signals to the base stations, the mobile terminal comprising:

a power amplifier arranged to amplify its input for transmission of an RF signal to a base station via at least one antenna;

a processor operatively coupled to the power amplifier, the processor being programmed to:

determine a respective weighting factor for each of a plurality of digital signals each corresponding to a respective channel;

combine said digital signals weighted by said weighting factors to produce a composite signal for supply to the input of said power amplifier;

dynamically calculate a metric related to the non-linearity of the power amplifier's transfer characteristics for the composite signal using the determined weighting factors; and control the transmission based on said metric related to the amplifier non-linearity;

wherein said communication network operates according to a set of scrambling codes, and the processor is programmed to perform said dynamic calculation by dynamically evaluating an expression that comprises moments of some combinations of the scrambling codes.

* * * * *